United States Patent
Greenlaw et al.

(10) Patent No.: US 6,319,804 B1
(45) Date of Patent: *Nov. 20, 2001

(54) PROCESS TO SEPARATE THE DOPING OF POLYGATE AND SOURCE DRAIN REGIONS IN DUAL GATE FIELD EFFECT TRANSISTORS

(75) Inventors: David Greenlaw, Portola Valley; Scott Luning, Palo Alto, both of CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/624,910

(22) Filed: Mar. 27, 1996

(51) Int. Cl.$^7$ .................................................. H01L 21/02
(52) U.S. Cl. ..................... 438/592; 438/591; 438/660; 438/655; 438/657
(58) Field of Search .................................. 438/591, 592, 438/FOR 193, FOR 177, 660, 655, 657

(56) References Cited

U.S. PATENT DOCUMENTS

| | | | |
|---|---|---|---|
| 4,984,043 | 1/1991 | Vinal | 357/23.14 |
| 4,990,974 | 2/1991 | Vinal | 357/23.3 |
| 5,108,953 | 4/1992 | Tateiwa | 437/200 |
| 5,290,717 | 3/1994 | Shimazu | 437/34 |
| 5,576,228 | * 11/1996 | Chen et al. | 437/35 |

FOREIGN PATENT DOCUMENTS

| | | |
|---|---|---|
| 0 308 152 A2 | 3/1989 | (EP) . |
| 0 422 824 A1 | 4/1991 | (EP) . |
| 526043 | * 2/1992 | (EP) . |
| 0 526 043 A1 | 2/1993 | (EP) . |
| 0 660 395 A2 | 6/1995 | (EP) . |

OTHER PUBLICATIONS

Bhatia et al., 'Self Aligned Silicone Gate IGFET Device', IBM Technical Disclosure Bulletin, vol. 20, No. 113, Apr. 1978.*
Pfiester et al., 'A TiN Strapped Polysilcone Gate Cobalt Salicide CMOS Process', International Technical Devices Meeting Technical Digest, Dec. 1990.*
Wolf, Stanley. Silicone Processing. California: Lattice Press. 1990, vol. 2, pp. 144–150.*

(List continued on next page.)

*Primary Examiner*—Christopher S. F. Low
*Assistant Examiner*—Anish Gupta
(74) *Attorney, Agent, or Firm*—Fliesler, Dubb, Meyer & Lovejoy (57) ABSTRACT

The present invention is directed toward a method for independently doping the gate and the source-drain regions of a semiconductor device. The method is initiated by the provision. of a substrate having isolation regions and a thin insulating layer. Over the substrate is formed a polysilicon layer which is doped with a first type of dopant at a first doping level. Over the polysilicon layer is formed a conducting layer of material that can withstand temperatures of 1000° C., and over the conducting layer is formed a blocking layer. The polysilicon layer, the conducting layer and the blocking layer are etched to form a gate stack. Source-drain regions are subsequently doped with a second type of dopant at a second doping level. Source-drain regions are activated in a 1000° C. heat cycle, and, subsequently, $TiSi_2$ is formed on the source-drain regions. Contacts are then formed. The blocking layer on the gate stack need not be removed, which aids in minimizing substrate damage and in prevention of shorting a source-drain contact region to the substrate.

29 Claims, 6 Drawing Sheets

OTHER PUBLICATIONS

H.S. Bhatia, D.A. Doney and F.J. Montillo, "Self–aligned Silicon Gate IGFET Device," IBM Technical Disclosure Bulletin, vol. 20, No. 113, Apr. 1978.

Calvin T. Gabriel and Milind G. Weling, "Gate Oxide Damage Reduction Using A Protective Dielectric Layer" 8179 IEEE Electron Device Letters, No. 8, Aug. 15, 1994.

James R. Pfiester, Thomas C. Mele, Young Limb, Robert E. Jones, Michael Woo, Bruce Boeck, and Craig D. Gunderson, "A TiN Strapped Polysilicon Gate Cobalt Salicide CMOS Process," International Technical Devices Meeting Technical Digest, Dec. 1990.

* cited by examiner

PROCESS TO SEPARATE THE DOPING OF POLYGATE AND SOURCE DRAIN REGIONS IN DUAL GATE FIELD EFFECT TRANSISTORS

BACKGROUND OF THE INVENTION

1. Field of Use

The invention relates to field effect transistor formation, and particularly to doping of the source-drain regions and the gate of a field effect transistor.

2. Description of Related Art

One of the most common building blocks in conventional electronic technology is the MOSFET transistor. As shown in the cross-section of FIG. 1, a MOSFET transistor 10 is composed of a substrate 12 upon which is formed a conducting gate 13, often formed of polysilicon. This gate is formed on top of a relatively thin insulating layer 19, often formed of thermal oxide, which electrically isolates the gate 13 from the underlying substrate 12. Within substrate 12 and on either side of polysilicon gate 13 are formed source and drain regions 14 and 15 (collectively, "source-drain regions"). MOSFET device 10 is separated from other devices which are formed on the same silicon wafer by isolation regions 16, which are conventionally formed of an oxide grown on substrate 12.

Figure 1A:
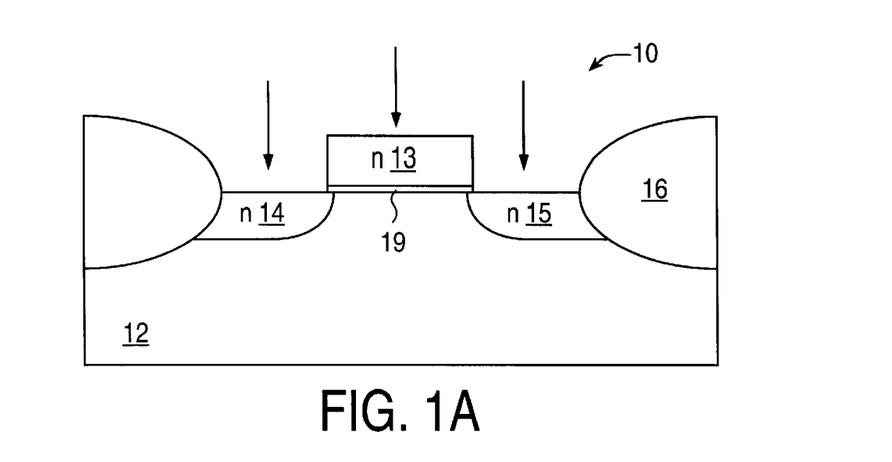
FIG. 1a is a cross-sectional view of a conventional semiconductor device.

In forming a conventional MOSFET device 10, isolation regions 16 are first grown or otherwise formed on substrate 12. A thin oxide layer 19 is grown, and a polysilicon layer is then deposited over thin oxide layer 19 and subsequently etched to form polysilicon gate 13. With polysilicon gate 13 acting as a natural mask, source-drain regions 14 and 15 are implanted with either an n-type or a p-type dopant (an n-type dopant is shown in FIG. 1a). While source-drain regions 14 and 15 are being doped, polysilicon gate 13 is also simultaneously doped with the same type of dopant as is used for doping the source-drain regions. Source-drain regions 14 and 15 are subsequently activated by heating the structure, causing annealing to occur by exposing the wafer to approximately 1000° C.

Figure 1B:
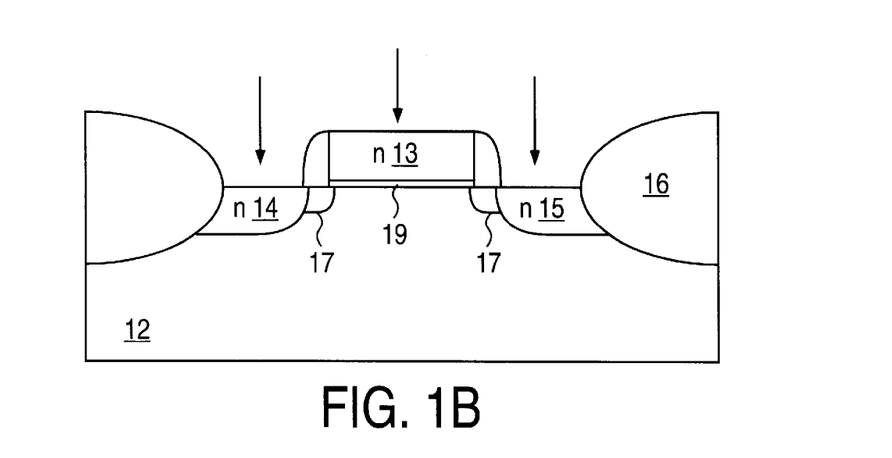
FIG. 1b is a cross-sectional view of a conventional semiconductor device with LDD regions.

Optionally, as shown in the cross-section of FIG. 1b, some devices are formed to have lightly doped source and drain (LDD) regions 17. To form LDD regions 17, substrate 12 with polysilicon gate 13 is first implanted or otherwise exposed to a dopant (either n-type or p-type). Spacers 18 are formed abutting gate 13. Substrate 12 with gate 13 and spacers 18 are then again exposed to the same type of dopant (n or p) as was previously used, to form more heavily doped source-drain regions 14 and 15. Spacers 18 protect the underlying substrate regions from further doping, resulting in LDD regions 17.

MOSFET transistors are subject to widespread use because of their high performance characteristics compared to other technologies as well as their relative ease of manufacturability. However, it is believed from simulation and experiment that another type of transistor, a FermiFET transistor, has even more desirable performance characteristics than a traditional MOSFET transistor, including higher drive currents, lower junction and/or gate capacitance, and better reliability.

Figure 2:
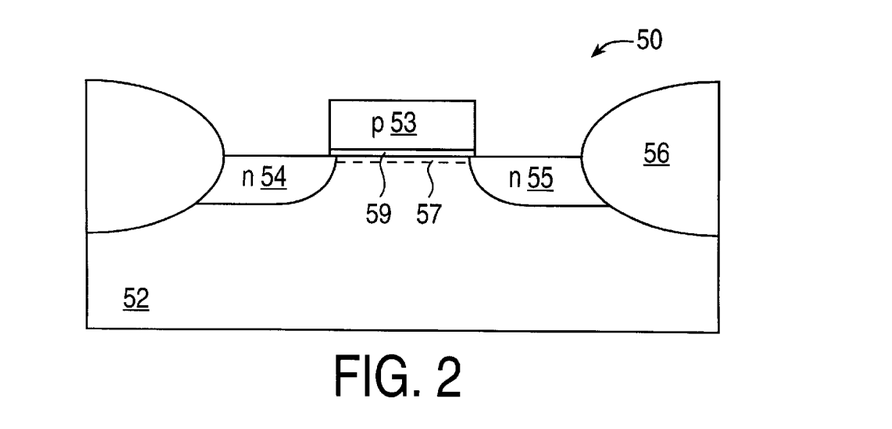
FIG. 2 is a cross-sectional view of a FermiFET device.

A cross-section of a FermiFET transistor is shown in FIG. 2. FermiFETs are structurally similar to the traditional MOSFET of FIG. 1, except that polysilicon gate 53 is oppositely doped from source-drain regions 54 and 55. That is, if source-drain regions 54 and 55 are n-doped, gate 53 is p-doped. Likewise, if source-drain regions 54 and 55 are p-doped, gate 53 is n-doped. In addition, Fermitub 57 is positioned between source-drain regions and below the gate and is formed in the substrate region, doped with the same type of dopant as source-drain regions 54 and 55.

While a FermiFET may possess improved performance characteristics, the opposite doping of gate and source-drain regions in a FermiFET creates the manufacturing dilemma of having to dope the gate oppositely from the source and drain, a dilemma which does not exist when forming the conventional MOSFET device of FIG. 1, in which both the source-drain and the gate regions are doped simultaneously. The doping of the source-drain regions is typically a heavy doping. Such heavy doping will also occur to the gate if left unmasked. Subsequent counter-doping of the gate to attain opposite net doping is difficult, particularly because mask alignment over or around the gate region to allow such counter-doping (or to prevent doping in the first place) is difficult once the gate has been cut. Subsequent counter-doping and mask alignment becomes increasingly troublesome when other devices such as conventional MOSFETs and other oppositely-doped FermiFETs are also being formed on a single wafer. Misalignment of the mask can lead to doping in inappropriate regions and create a non-working device.

Thus, while the benefits of FermiFETs have been simulated, they have gone virtually unused because of difficulties in fabricating multiple devices on a single wafer, and particularly in achieving an oppositely doped gate.

In addition, conventional MOSFET devices, such as those shown in FIGS. 1a and 1b, often experience less than optimal performance when the source-drain regions and the gate are doped at equal levels with the same type of dopant. For instance, when the source-drain regions are heavily doped with boron, the gate will also be heavily doped with boron, which may lead to boron penetration. During high temperature processing steps, boron diffuses from the gate into the substrate, changing the characteristics of the substrate region and thin insulating layer underlying the gate. If the gate were to be lightly doped with boron or some other material, while the source-drain regions remained heavily doped with boron, boron penetration would be minimized. However, as with FermiFET formation, problems occur with subsequent counter-doping and mask placement in trying to form variant doping levels between the gate and the source-drain regions.

Given these problems, it is desirable to develop a method of independently doping the gate and the source-drain regions of a transistor device, and to do so in a way that requires no counter-doping or mask alignment over a formed gate.

Figure 3:
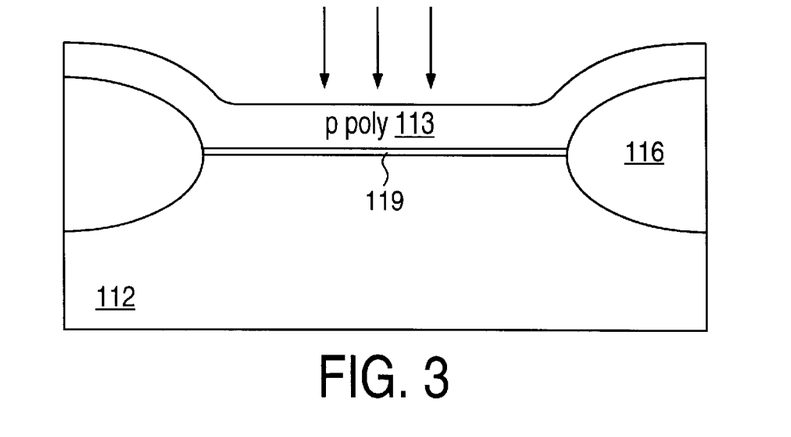
FIG. 3 is a cross-sectional view of a partially formed semi-conductor device formed utilizing one method of independently doping gate and source-drain regions.
Figure 4:
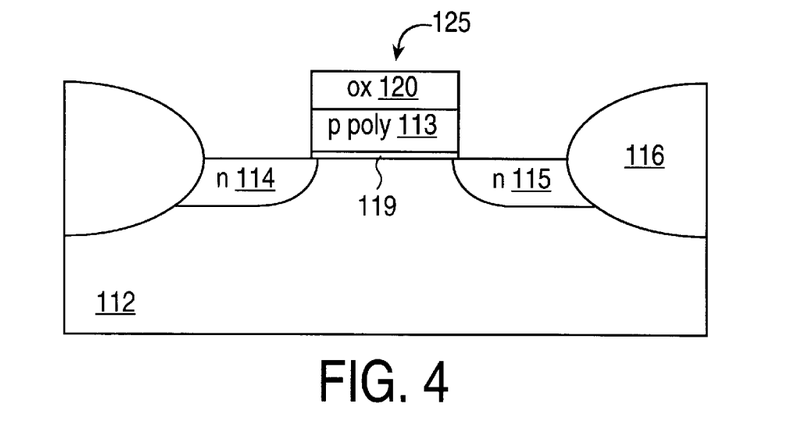
FIG. 4 is a cross-sectional view of a partially formed semiconductor device formed utilizing one method of independently doping gate and source-drain regions.
Figure 5:
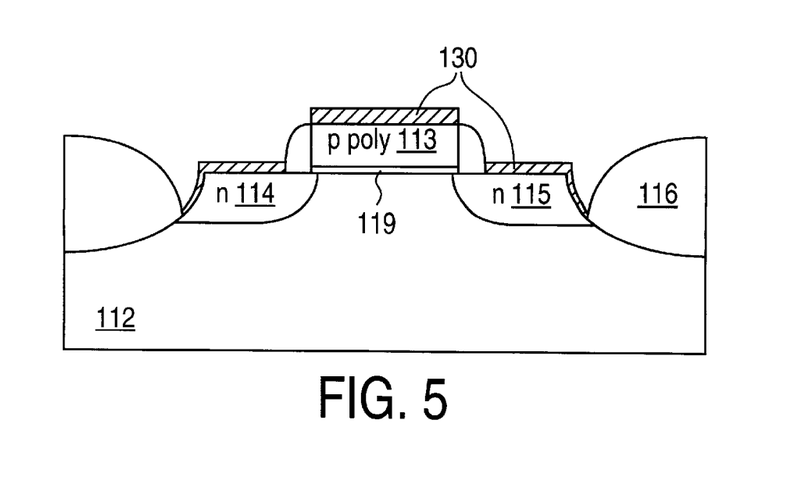
FIG. 5 is a cross-sectional view of a device formed utilizing one method of independently doping gate and source-drain regions.

One proposed method for achieving independent doping of the source-drain regions and the gate region is demonstrated with reference to FIGS. 3–5. In FIG. 3, a layer of polysilicon 113 is deposited over thin oxide region 119 and substrate 112 having field oxide regions 116. Polysilicon region 113 is doped with a first dopant, which is a p-type dopant in FIG. 3. An oxide blocking layer 120 is formed over polysilicon layer 113. Oxide layer 120 and polysilicon layer 113 are etched to form gate stack 125 in FIG. 4. Subsequently, source-drain regions 114 and 115 are implanted with a second dopant, which is an n-type dopant in FIG. 4. During the implanting of regions 114 and 115, polysilicon region 113 is protected from further doping by oxide layer 120.

In order to form contacts with the source-drain regions 114 and 115 as well as the gate region 113, titanium silicide (TiSi$_2$) is conventionally grown upon these regions (source, drain and gate). TiSi$_2$ also lowers the device resistance and increases the device speed. However, in order to grow TiSi$_2$ on the polysilicon gate region 113 of FIG. 4, oxide layer 120 must be removed from gate stack 125. The process of etching oxide layer 120 will also cause field oxide isolation regions 116 to be etched down as well. As a result and as shown in FIG. 5, when titanium silicide layer 130 is grown on source-drain regions 114 and 115, junction leakage along the edges of source-drain regions 114 and 115 can occur. In an extreme case, the titanium silicide layer 130 will go below the n-doped regions 114 and 115, causing a short to the substrate 112. Both junction leakage and shorting cause unacceptable device characteristics, making this proposed method difficult to reliably utilize.

Thus, a more reliable method of independently doping the gate and source-drain regions of a transistor device in a manner that does not require removal of the blocking layer is desired.

SUMMARY OF THE INVENTION

The present invention, roughly described, is a method for independently doping the gate and the source-drain regions of field effect transistors. It is desirable to create semiconductor devices having variant doping levels in the gate and the source-drain regions or having opposite doping in the gate and the source-drain regions. However, it is further desirable to achieve opposite doping or variant doping without having to mask or counter-dope the gate.

The process used to independently dope the gate and the source-drain regions begins with a silicon substrate having isolation regions and a thin insulating layer. A polysilicon or other conducting layer is formed over the substrate and thin oxide layer and a first doping material is introduced into the polysilicon layer to "pre-dope" the gate. A layer of conducting material which can withstand subsequent thermal processing is formed over the polysilicon layer to "pre-silicide" the gate. A blocking layer is formed over the layer of conducting material.

The polysilicon layer, the conducting layer and the blocking layer are etched to form a gate stack. Source-drain regions are doped using the gate stack as a natural mask. The blocking layer blocks any subsequent implantation of the gate that may result from implanting the source-drain regions. Source-drain regions are then activated in a heat cycle of approximately 1000° C. TiSi$_2$ or other highly-conductive material is grown or deposited on the source-drain regions and contacts are etched.

The process in accordance with the invention is advantageous in that it allows independent doping of source-drain regions and the gate of a transistor device without having to mask and/or counter-dope the gate and without having to remove a blocking layer.

The process in accordance with the invention is further advantageous in that it allows for the manufacturability of FermiFETs, which may have improved performance characteristics over conventional MOSFETs.

The process in accordance with the invention is further advantageous in that it allows for the fine tuning of doping levels, enabling a semiconductor device to be formed which has light doping in the gate and heavy doping in the source-drain regions or vice versa. Such fine tuning can minimize boron penetration and other problems.

BRIEF DESCRIPTION OF THE DRAWINGS

The invention will be described with respect to particular embodiments thereof, and reference will be made to the drawings, in which.

DETAILED DESCRIPTION OF INVENTION

In accordance with the invention, a method of independently doping the source-drain regions and the gate of a semiconductor device is disclosed. Such a method of independent doping allows the formation of FermiFETs, which are devices possessing oppositely doped gate and source-drain regions and which may have improved performance characteristics over conventional MOSFET devices, including higher drive currents, lower junction and/or gate capacitance, and better reliability. In addition, such a method of independent doping can be used to improve the performance characteristics of other semiconductor devices by allowing variant doping levels, or "fine-tuning" of doping levels, in the source-drain regions independently from the gate region of a semiconductor device.

One method for independent gate and source-drain region doping is to "pre-dope" the polysilicon layer as was discussed with reference to FIG. 3, discussed in the "Background of the Invention" section. However, rather than overlying polysilicon layer 113 with an oxide layer as shown in FIG. 4, a layer of silicon oxynitride (SiON) (not shown) is formed over polysilicon layer 113. The gate stack is etched and the source-drain regions are subsequently doped. The SiON layer prevents the polysilicon layer from being additionally doped during the source-drain region doping step, and SiON strips in phosphoric acid which does not attack oxide, thus leaving field oxide regions 116 intact and exposing the gate to enable TiSi$_2$ treatment. However, the phosphoric acid used to strip the SiON layer may react with doped silicon regions (source-drain regions 114 and 115), causing these regions to be etched down. As a result, junction leakage, and possible shorting, may occur when $TiSi_2$ is formed.

Another method for independent doping of polysilicon gate and source-drain regions is to "pre-dope" the polysilicon layer 113 as was done in FIG. 3, and then "pre-silicide" the gate by growing a layer of $TiSi_2$ (not shown) over the polysilicon layer 113. A blocking oxide layer is then formed over the $TiSi_2$ layer. Subsequently, the gate is cut to form a gate stack, and the source-drain regions are doped with a second doping material (the gate is protected from further doping by the blocking oxide layer). With this method, because the gate has already been silicided, the protective oxide layer does not need to be stripped. However, in order to activate source-drain regions, the device is heated to temperatures of approximately 1000° C. $TiSi_2$ cannot survive temperatures of 1000° C. and therefore the pre-silicided layer of $TiSi_2$ formed over the gate in this method is destroyed, leaving the device in the same situation as before—having to strip the oxide blocking layer and silicide the gate without resulting junction leakage or shorting. Moreover, etching of $TiSi_2$ is not commonly practiced, making even the formation of the gate stack difficult.

Thus, in accordance with the present invention, a method has been developed that avoids the problems of the above methods. That is, a method is disclosed for independently doping a gate region and source-drain regions without having to remove a blocking layer while also allowing each of these regions to be "silicided" (layered with a conducting material that lowers resistance and increases device speed). Such method is described with reference to FIGS. 6–12.

Figure 6:
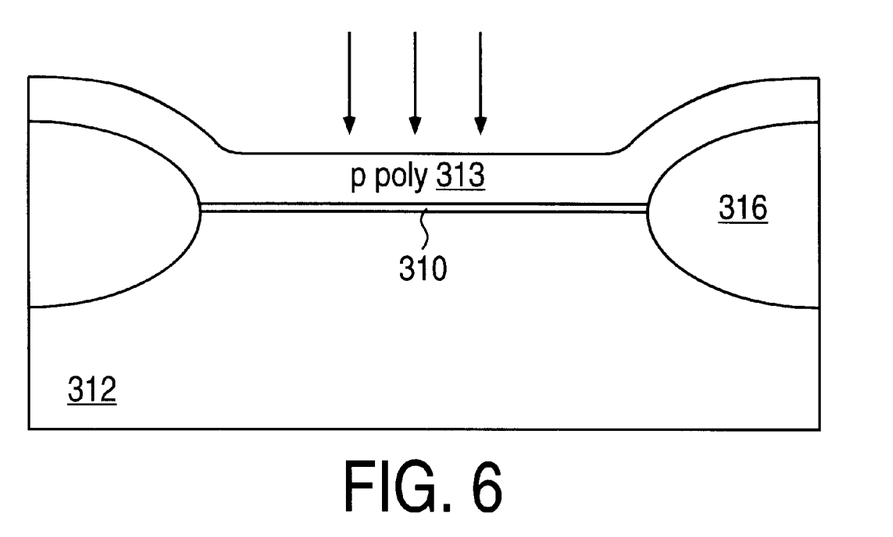
FIG. 6 is a cross-sectional view of a partially formed semiconductor device formed utilizing a method in accordance with the invention.

In accordance with the invention and as shown in FIG. 6, substrate 312 is provided having isolation regions 316 and upon which is grown or deposited an overlying thin insulating layer 310 which may be formed of oxide. A conducting layer 313, which may be formed of polysilicon in one embodiment of the invention, is deposited over substrate 312 and subsequently doped with a first type of dopant, which is a p-type dopant in FIG. 6, and at a first doping level. Other embodiments of the invention may dope polysilicon region 313 with an n-type dopant. Doping may occur by ion implantation or other well known doping techniques. If the device being formed with an embodiment of the invention is a FermiFET device, a Fermitub should additionally be formed by doping substrate 312 with the same type of dopant (n or p) as will be used in forming source-drain regions prior to forming thin insulating layer 310.

Figure 7:
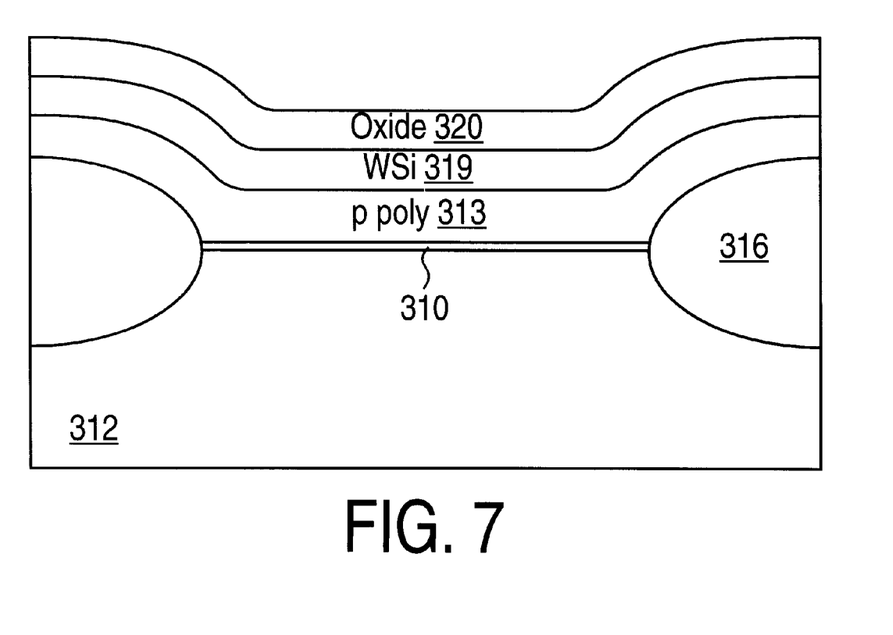
FIG. 7 is a cross-sectional view of a partially formed semiconductor device formed utilizing a method in accordance with the invention.

Referring to FIG. 7, a layer of tungsten silicide (WSi) 319 is deposited over polysilicon layer 313. WSi has many of the same properties as $TiSi_2$ in that it creates a low resistance gate and increases the device speed. However, WSi can survive temperatures of approximately 1000° C. and can thus survive the later thermal processing used to activate the source-drain regions (or any other heat cycle utilized). WSi layer 319 should be thick enough to create a low resistance gate and also thick enough to stop the later contact etch. In one embodiment of the invention the WSi layer 319 is approximately 1000 Å. In alternative embodiments of the invention, WSi may be replaced by TiN or any other conducting material that can survive subsequent thermal processing, including a heat cycle necessary to activate dopants.

An oxide blocking layer 320 is deposited over WSi layer 319. Oxide blocking layer 320 serves to block subsequent implantation of either WSi layer 319 or polysilicon layer 313. In alternative embodiments blocking layer 320 may be formed of silicon nitride ($Si_3N_4$) or other material that can withstand the high temperature processing and through which a later contact etch can penetrate. Blocking layer 320 must be thick enough to block subsequent implants, however, the thickness will depend on the energy of the implant. If a 40 keV implant of boron or arsenic is used, an approximate thickness of 1000 Å for oxide blocking layer 320 is sufficient.

Figure 8:
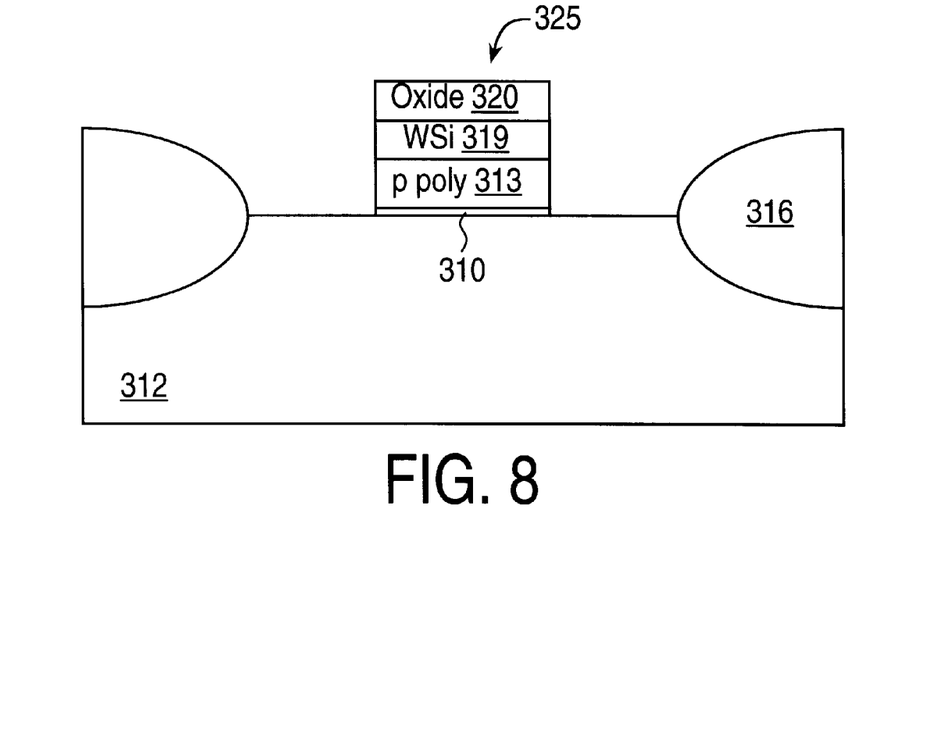
FIG. 8 is a cross-sectional view of a partially formed semiconductor device formed utilizing a method in accordance with the invention.
Figure 9:
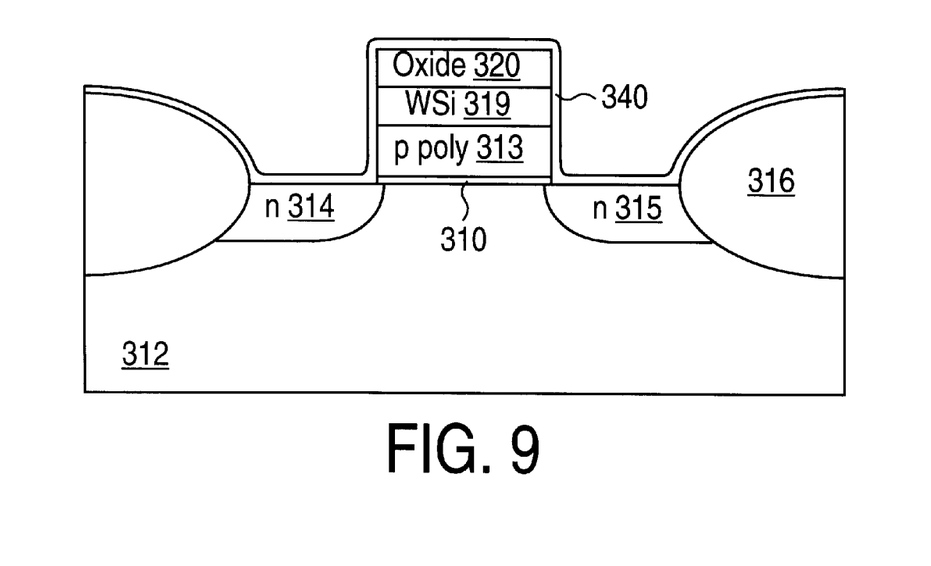
FIG. 9 is a cross-sectional view of a partially formed semiconductor device formed utilizing a method in accordance with the invention.

Polysilicon layer 313, WSi layer 319, and blocking oxide layer 320, are etched to form gate stack 325, as shown in FIG. 8. In FIG. 9, source-drain regions 314 and 315 are doped with a second type of dopant, which is an n-type dopant in FIG. 9, at a second doping level. In alternative embodiments, the dopant may be a p-type dopant in regions 314 and 315. Prior to doping regions 314 and 315, one embodiment in accordance with the invention deposits or grows a thin oxide layer 340 around gate stack 325 to prevent the polysilicon gate 313 (or the WSi layer 319) from being implanted from the side during the source-drain doping. Above polysilicon layer 313, doping is stopped by the oxide layer 320.

In one embodiment of the invention LDD (lightly doped source and drain) regions 317 are formed. One way to form LDD regions is, after introducing a dopant into substrate 312 using gate stack 325 as a natural mask (as described in reference to FIG. 9), to form spacers 318 abutting gate stack 325 by depositing an oxide layer over exposed substrate regions 314 and 315 as well as over gate stack 325 and anisotropically etching the oxide spacer layer to form spacers 318. Source-drain regions are again doped; however, spacers 318 block regions 317 from subsequent implantation. Regions 314 and 315 then become more heavily doped regions (n+ in FIG. 10) than regions 317. Other methods of forming LDD regions are also suitable and could be used in other embodiments of the invention.

Figure 10:
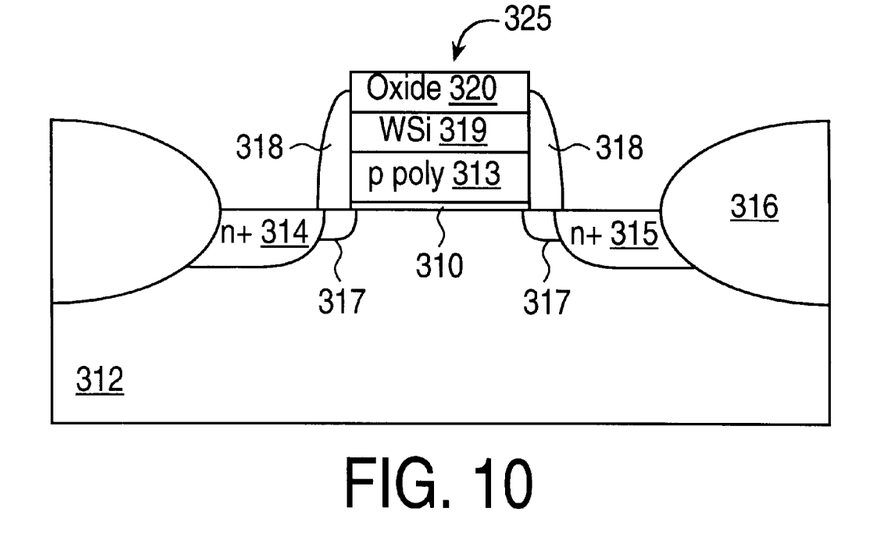
FIG. 10 is a cross-sectional view of a partially formed semiconductor device formed utilizing a method in accordance with the invention.

Source-drain regions 314 and 315 are activated by subjecting the wafer to a heat cycle of approximately 1000° C. WSi layer 319 can withstand high temperature processing and is thus unaffected by the heat cycle.

Figure 11:
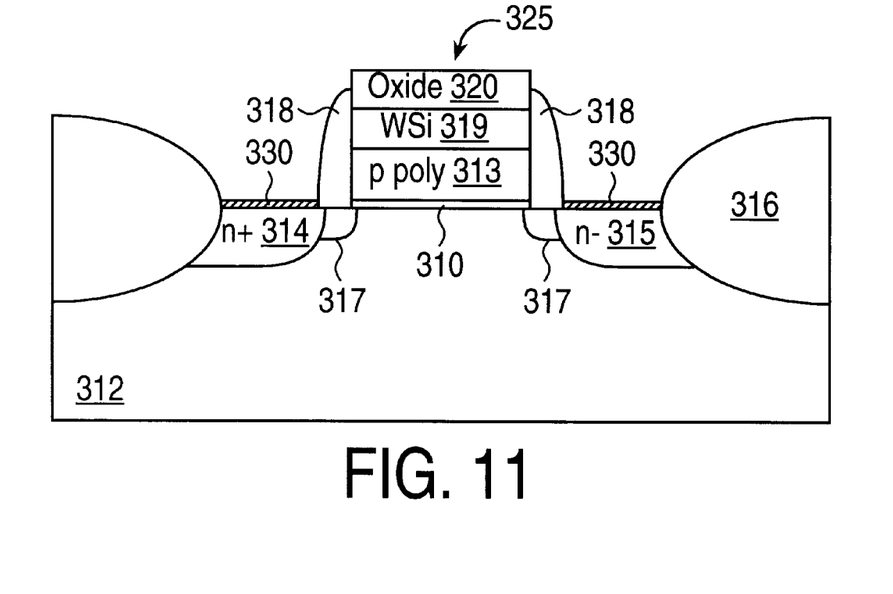
FIG. 11 is a cross-sectional view of a device formed utilizing a method in accordance with the invention.

In FIG. 11 $TiSi_2$ layers 330 are grown by depositing titanium (Ti) over the entire wafer construct. Ti reacts with the silicon (Si) of the wafer to form $TiSi_2$ layers 330 over source-drain regions 314 and 315. Ti does not react with oxide regions and thus will form $TiSi_2$ only on exposed substrate regions 314 and 315. Thus, in order to protect WSi layer 319 and polysilicon layer 313 from shorting to the $TiSi_2$ layers 330, spacers 318 are formed in one embodiment of the invention, regardless of whether LDD regions 317 are also formed. Spacers 318 do not need to reach the top of gate stack 325 but only need to be large enough to protect polysilicon layer 313 and WSi layer 319.

In some situations, the need for $TiSi_2$ over the source-drain regions is not present, such as when the low resistance characteristics of $TiSi_2$ are not required. In those situations where $TiSi_2$ will not be formed over source-drain regions, the need for spacer protection for layers 313 and 319 is eliminated as well.

Figure 12:
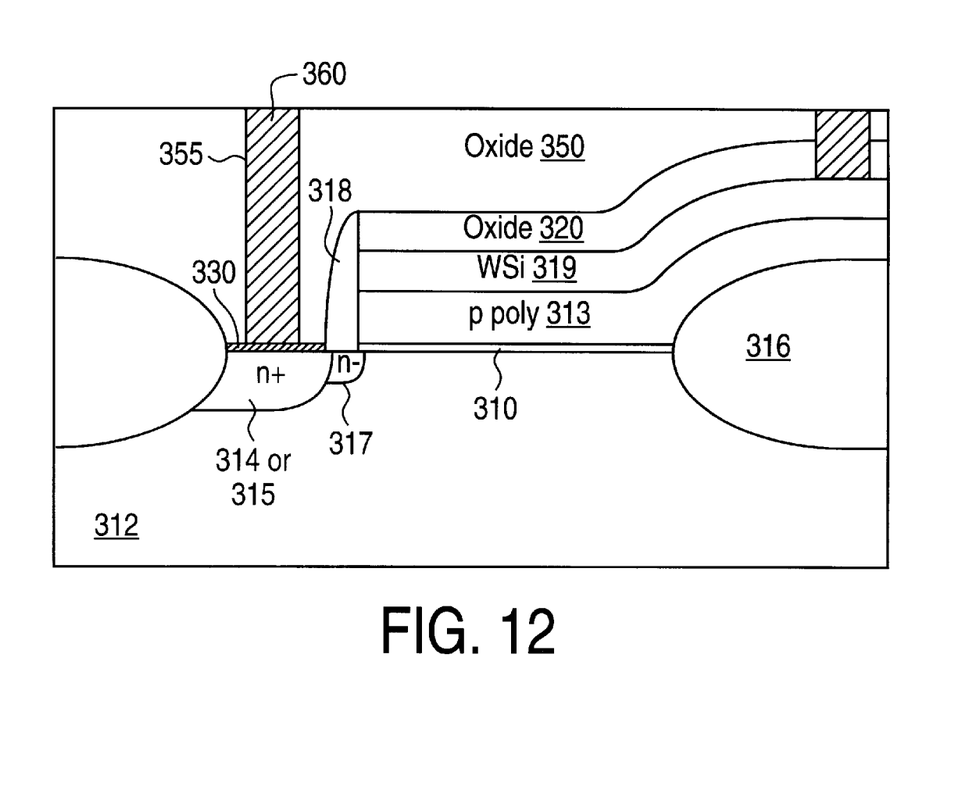
FIG. 12 is a cross-sectional side view representing a device with contacts formed utilizing a method in accordance with the invention.

Referring to the cross-sectional side view of FIG. 12, once source-drain regions have been silicided (FIG. 11) by layers 330, contacts can be formed. A top oxide overlayer 350 is deposited or otherwise formed over the entire wafer construct including oxide layer 320 and $TiSi_2$ regions 330. The oxide overlayer 350 is then masked and etched with a selective oxide etch to form contact channels 355. A selective oxide etch will penetrate oxide overlayer 350 and oxide layer 320, but will stop on TiSi$_2$ as well as WSi layers 330 and 319. The channels 355 are then filled with a conductive substance, which in one embodiment is tungsten (W), thus forming contacts to the source-drain regions 314 and 315 through TiSi$_2$ layer 330 and to the polysilicon gate 313 through WSi layer 319.

Thus, a process has been described for independently doping the source-drain regions and the polysilicon gate regions of a semiconductor device which does not require the removal of the blocking layer. Such a process can be used to form oppositely doped source-drain regions and gate regions as would be required to build a FermiFET.

Such a process is also useful in doping source-drain regions and gate regions which have the same type of dopant but with varying levels of doping, (e.g., heavy doping in the source-drain regions and light doping in the gate or vice versa). Varying dopant levels in the gate and source-drain regions is particularly useful to alleviate boron penetration, which occurs when the gate is heavily doped with boron. During high temperature steps, boron diffuses into the substrate and changes the characteristics of the underlying regions. However, by independently doping the gate and the source-drain regions, the gate can be lightly doped while the source-drain regions are heavily doped, thereby minimizing boron penetration. Alternatively, the gate could be doped with a different dopant material from that used to dope the source-drain regions, although both dopants could be of the same type (either n-type or p-type).

A method in accordance with the invention can also be easily adopted when there are multiple devices on a single wafer, some of which have opposite doping and some of which do not (e.g., the wafer may contain some devices with a p-type gate and n-type source-drain regions, some devices with n-type gates and p-type source-drain regions, some devices with p-type gates and p-type source-drain regions, as well as some devices with n-type gates as well as n-type source-drain regions).

It should be understood that the particular embodiments described above are only illustrative of the principals of the present invention, and various modifications could be made by those skilled in the art without departing from the scope and spirit of the invention. Thus, the scope of the present invention is limited only by the claims that follow.

What is claimed is:

1. A method of forming a semiconductor device, comprising the steps of
    a) providing a substrate having an insulating layer formed thereon;
    b) forming a gate stack over said substrate, said gate stack having:
        (i) a first gate material layer doped with a first dopant at a first doping level;
        (ii) a first conducting layer comprised of a conducting material capable of surviving thermal processing; and
        (iii) a blocking layer thicker than about 1000 Å;
    c) forming heavily doped source-drain regions in said substrate, said heavily doped source-drain regions in said substrate doped with a second dopant at a second doping level;
    d) forming a second conducting layer over said heavily doped source-rain regions; and
    e) performing an activation cycle comprising heating said substrate to at least approximately 1000° C.

2. The method of claim 1 wherein step (b) includes forming a gate stack having a first gate material layer composed of polysilicon.

3. The method of claim 1, wherein step (c) includes forming said source-drain regions doped with a second dopant equivalent in type to said first dopant and at a second doping level differing from said first doping level.

4. The method of claim 1, wherein step (b) includes forming said gate stack having said blocking layer composed of an oxide.

5. The method of claim 1, wherein step (b) includes forming said gate stack having said blocking layer composed of silicon nitride.

6. The method of claim 1, wherein the step of forming a second conducting layer over said source-drain regions includes forming a TiSi$_2$ layer over said source-drain regions.

7. The method of claim 1, further comprising the step of forming a contact coupled with said first conducting layer of said gate stack.

8. The method of claim 1, wherein step (c) includes forming said source-drain regions doped with a second dopant of opposite type to said first dopant.

9. The method of claim 1, wherein said conducting material capable of surviving thermal processing is selected from the group consisting of WSi and TiN.

10. A method of forming a semiconductor device, comprising the steps of:
    a) providing a substrate having an insulating layer formed thereon;
    b) forming a gate stack formed over said substrate, said gate stack having:
        (i) a first gate material layer doped with a first dopant at a first doping level;
        (ii) a first conducting layer comprised of a conducting material capable of surviving thermal processing; and
        (iii) a blocking layer thicker than about 1000 Å;
    c) forming heavily doped source-rain regions in said substrate, said heavily doped source-drain regions in said substrate doped with a second dopant at a second doping level, said dopant introduced at an energy of about 40 KeV;
    d) forming a second conducting layer over said heavily doped source-drain regions; and
    e) performing an activation cycle comprising heating said substrate to at least approximately 1000° C.

11. The method of claim 10, wherein said first conducting material is selected from the group consisting of WSi and TiN.

12. A method of forming a semiconductor device, comprising the steps of:
    a) providing a substrate having isolation regions;
    b) forming an insulating layer over said substrate;
    c) forming a polysilicon layer over said substrate;
    d) doping said polysilicon layer with a first dopant at a first doping level;
    e) forming a first conducting layer over said polysilicon layer with a conducting material capable of surviving an activation cycle;
    f) forming a blocking layer over said first conducting material layer, said blocking layer having a thickness of about 1000 Å;
    g) etching said blocking layer, said first conducting layer, and said polysilicon layer to form a gate stack and to define source-drain regions;

h) doping said source-drain regions with a second dopant at a second doping level to form heavily doped source-drain regions; and i) forming a second conducting layer over said heavily doped source-drain regions.

13. The method of claim 12, wherein step (h) includes doping said source-drain regions with a second dopant equivalent in type to said first dopant and at a second doping level differing from said first doping level.

14. The method of claim 12, wherein step (h) includes forming said source-drain regions doped with a second dopant of opposite type to said first dopant.

15. The method of claim 12, wherein step (f) includes forming an oxide blocking layer over said first conducting material layer sufficient to prevent dopant penetration into said first conducting material layer when said dopant is implanted at an energy of about 40 KeV.

16. The method of claim 12, wherein step (f) includes forming a silicon nitride blocking layer over said first conducting material layer.

17. The method of claim 12, further comprising the step of activating said source-drain regions.

18. The method of claim 17, wherein said step of activating includes exposing said substrate to a temperature of at least approximately 1000° C.

19. The method of claim 1, wherein said step of forming a second conducting layer includes forming a $TiSi_2$ layer over said source-drain regions.

20. The method of claim 19, further comprising, preceding said step of forming a second conducting layer, the step of forming spacers abutting said gate stack.

21. The method of claim 20, wherein said step of forming spacers comprises:

forming an oxide spacer layer over said gate stack and said source-drain regions; and etching said oxide spacer layer.

22. The method of claim 12, further comprising, preceding step (h), the step of forming a protective oxide layer around the gate stack.

23. The method of claim 12, further comprising the steps of:

forming an oxide overlayer over said substrate; and forming a contact coupled with said first conducting layer.

24. The method of claim 23, wherein said step of forming a contact comprises:

etching said oxide overlayer with a selective oxide etch process to form a channel therethrough, said channel terminating at said first conducting layer; and filling said channel with a second conductive material.

25. In forming a semiconductor device having a gate and source-drain regions, a method for independently doping the gate and the source-drain regions, comprising the steps of:

a) providing a substrate having isolation regions;

b) forming a thin oxide insulating layer over said substrate;

c) forming a polysilicon layer over said thin insulating layer;

d) introducing into said polysilicon layer a first dopant at a first doping level;

e) forming a WSi or TiN layer over said polysilicon layer;

f) forming an oxide blocking layer having a thickness of about 1000 Å over said WSi or TiN layer sufficient to prevent dopant penetration into said layer formed in step (e);

g) etching said oxide blocking layer, said WSi or TiN layer, and said polysilicon layer to form a gate stack and to define source-drain regions;

h) forming a protective oxide layer around said gate stack;

i) introducing into said source-drain regions and not into said polysilicon layer a second dopant at a second doping level;

j) exposing said substrate to a temperature of at least approximately 1000° C.;

k) forming oxide spacers abutting said gate stack and having a height that reaches to at least the top of said WSi or TiN layer;

l) forming a $TiSi_2$ layer over said source-drain regions;

m) forming a top oxide overlayer over said gate stack and said source-drain regions;

n) forming contacts with said WSi or TiN layer and said $TiSi_2$ layer.

26. The method of claim 25, wherein step (i) includes introducing into said source-drain regions a second dopant equivalent in type to said first dopant and at a second doping level differing from said first doping level.

27. The method of claim 25, wherein step (k) comprises:

forming an oxide spacer layer over said gate stack and said source-drain regions; and etching said oxide spacer layer.

28. The method of claim 25, wherein step (n) comprises:

etching said top oxide overlayer with a selective oxide etch process to form channels therethrough, said channels terminating respectively at said WSi or TiN layer and said $TiSi_2$ layer; and filling said channels with a conductive material.

29. The method of claim 25, wherein step (i) includes forming said source-drain regions doped with a second dopant of opposite type to said first dopant.

* * * * *